United States Patent
Veryaskin

(10) Patent No.: US 7,176,680 B1
(45) Date of Patent: Feb. 13, 2007

(54) MEASUREMENT OF MAGNETIC FIELDS USING A STRING FIXED AT BOTH ENDS

(75) Inventor: Alexey V. Veryaskin, Blockhouse Bay (NZ)

(73) Assignee: Gravitec Instruments Limited, Guernsey (GB)

( * ) Notice: Subject to any disclaimer, the term of this patent is extended or adjusted under 35 U.S.C. 154(b) by 0 days.

(21) Appl. No.: 09/979,291

(22) PCT Filed: May 11, 2000

(86) PCT No.: PCT/EP00/04270

§ 371 (c)(1),
(2), (4) Date: Feb. 26, 2004

(87) PCT Pub. No.: WO00/68702

PCT Pub. Date: Nov. 16, 2000

(30) Foreign Application Priority Data

May 11, 1999 (GB) ................. 9910932.4

(51) Int. Cl.
*G01R 33/00* (2006.01)
(52) U.S. Cl. ........................ 324/260; 324/244
(58) Field of Classification Search .............. 324/106, 324/117 R, 117 H, 326, 330, 331, 334, 339, 324/347, 348, 354, 363, 364, 207.11, 207.15, 324/207.17, 207.22, 244, 248, 258, 260, 324/263; 33/355; 73/382 G, 382 R
See application file for complete search history.

(56) References Cited

U.S. PATENT DOCUMENTS 5,670,882 A * 9/1997 Brandolino et al. ........ 324/345

FOREIGN PATENT DOCUMENTS

| DE | 952 369 C | * | 5/1956 |
| GB | 1038776 A | * | 8/1966 |
| JP | 03231176 A | * | 10/1991 |
| JP | 04077686 A | * | 3/1992 |
| JP | 05026990 A | * | 2/1993 |
| JP | 6294900 A | * | 10/1994 |
| WO | WO 9610759 A1 | * | 4/1996 |

OTHER PUBLICATIONS

"Fundamentals of Physics" by Holliday et al., Fifth Edition, 1997, p. 713.*

* cited by examiner

*Primary Examiner*—Edward Lefkowitz
*Assistant Examiner*—David M. Schindler
(74) *Attorney, Agent, or Firm*—Alix, Yale & Ristas, LLP

(57) ABSTRACT

A method and apparatus for detecting magnetic fields in which a string (1) carries an alternating current. The displacement of the string from its unperturbated position due to a magnetic gradient across the string is detected by pick-up coils (L1, L2). The signals from the pick-up coils are demodulated using a signal derived from the alternating current to produce an output.

20 Claims, 3 Drawing Sheets

MEASUREMENT OF MAGNETIC FIELDS USING A STRING FIXED AT BOTH ENDS

BACKGROUND OF THE INVENTION

The present invention relates to the measurement of components of the magnetic gradient tensor, the measurement of which is known as magnetic gradiometry.

Accurate absolute measurements of the spatial derivatives of magnetic induction, i.e. the magnetic gradient tensor $B_{ij}=\partial B_i/\partial j$ (ij=x,y,z), taken at some local coordinate frame OXYZ are very important to progress in the fields of geological prospecting, sea and underwater navigation and exploration, terrestrial and marine archaeology and medicine (magnetocardiography and magnetoencephalography). One reason for this importance in relation to geology and archaeology is that the Earth's magnetic field is approximately uniform in most regions of interest, so that magnetic gradient measurements are unaffected by the Earth's magnetic field.

GB-A-1038776, DE-C-952369, JP05/026990 and JP04/077686 each describe magnetic field measuring apparatus.

There do not currently exist any devices which are capable of directly measuring magnetic gradients. One known indirect method uses two or more spaced magnetometers to take readings of the magnetic induction. The measurements from the magnetometers are differenced and divided by the spacing at which the readings were taken, to give an approximation of the magnetic gradient. The magnetometers are usually spaced by around 50 cm, which leads to a relatively large apparatus. In addition, two magnetometers are required for each direction along which the gradient is to be measured, which increases the cost of the apparatus.

Magnetic flux gradiometers exist which utilise SQUIDs (Superconducting Quantum Interference Devices), but these require cryogenic temperatures and finely balanced superconducting pick-up coils, which limit their practical usefulness and accuracy.

SUMMARY OF THE INVENTION

The present invention utilises a novel sensitive element in the form of a current-carrying string and suitable sensors to detect magnetic gradients.

Thus, viewed from a first aspect the invention provides apparatus according to claim 1.

By "string" no particular limitation as to material or construction is intended. Any elongate element is included which is capable of carrying a current, of being transversely deflected by a magnetic field and of providing a restoring force.

Viewed from a further aspect, the invention provides a method according to claim 8

An unperturbated flexible string with fixed ends forms an absolute line in space going through the points where the ends of the string are fixed. This line can be arbitrarily selected as one of the axes of a local cartesian coordinate frame, say Z, with the other two axes, X and Y, chosen to lie in the plane transverse to the direction of the string. Any string deflection from this line is caused by absolute values of the transverse components of the force per unit length which acts on each unit element of the string. The force per unit length is due to the ambient gravitational field and, when the string carries a current, to the ambient magnetic field.

The displacement y(z, t) of a string of length l from its unpertubated position, for example, in the Y-direction of the above local coordinate frame as a function of the z-position of a unit element and time can be described by the following differential equation $$\eta\frac{\partial^2}{\partial t^2}y(z,t) + h\frac{\partial}{\partial t}y(z,t) - \frac{YA}{l}\frac{\Delta l}{l}\frac{\partial^2}{\partial z^2}y(z,t) = \\ -\eta g_y(0,t) - \eta\Gamma_{yz}(0,t)z + I(t)B_x(0,t) + I(t)B_{xz}(0,t)z + \text{noise} \quad (1)$$

with boundary conditions corresponding to the fixed ends of the string, i.e. y(O, t)=y(l, t)=0. In this equation η denotes the string's mass per unit length, h is the friction coefficient per unit length, the parameters Y, A and Δl/l are the string's Young modulus, the area of its cross-section and the string's strain respectively. The quantities $g_y(O, t)$ and $\Gamma_{yz}(O, t)$ are the absolute values of the y-component of the total acceleration and the corresponding gravity gradient tensor component along the string, both taken at the centre of the local coordinate frame chosen.

The quantity I(t) is the current flowing through the string. It is well known that a conductor carrying a current I(t) in a non-uniform magnetic field of flux density B(x,y,z) is subject to force F=I(t){n×B(x,y,z)}, where n is the unit vector in the direction of current flow, in this case the Z direction. The quantities $B_x(O, t)$ and $B_{xz}(O, t)$ therefore represent the absolute values of the x-component of the magnetic induction and the corresponding magnetic gradient tensor component along the string, booth taken at the centre of the local coordinate frame chosen.

In this example, the y-direction has been chosen as an arbitrary example to simplify the explanation of the invention. However, the foregoing and following analysis is equally applicable to any direction transverse to the string or any number of directions.

Applying Fourier analysis to the complex shape of the string caused by its interaction with the magnetic and gravitational fields, the function y(z, t), can be described, in the range z=0 to z=1, by an infinite sum of sinusoidal functions of period 2l, with appropriate coefficients $c_y(n, t)$. Thus, a solution of Equation (1), which satisfies the boundary conditions shown above, can be represented by the following infinite sum wherein each term in n corresponds to one of the string's natural vibrational modes $$y(z,t) = \sum_{n=1}^{\infty} c_y(n,t)\sin\left(\frac{\Pi n}{l}z\right) \quad (2)$$

By substituting Equation (2) into Equation (1) and by multiplying both sides by sin(πn'z/l), and then by integrating both sides over z from 0 to 1, one can obtain the differential equation for $c_y$(n, t)

$$\frac{d^2}{dt^2}c_y(n,t) + \frac{2}{\tau}\frac{d}{dt}c_y(n,t) + \omega_n^2 c_y(n,t) = \\ \frac{2}{\Pi n}[(-1)^n - 1]\left[g_y(0,t) + \frac{1}{\eta}I(t)B_x(0,t)\right] + \\ (-1)^n\frac{2l}{\Pi n}\left[\Gamma_{yz}(0,t) + \frac{1}{\eta}I(t)B_{xz}(0,t)\right] + \text{noise} \quad (3)$$

where the quantities $$\omega_n = \frac{\Pi n}{l}\sqrt{\frac{Y}{\rho}\frac{\Delta l}{l}} \quad (4)$$

represent the strings's natural frequencies, and τ and ρ are the relaxation time and the volume mass density of the string respectively. Thus, when n=1, $\omega_n$ represents the fundamental resonant frequency of the string.

The displacement of the string from its unperturbated position may be measured in the y (and or x) direction by one or more suitable sensors positioned along the length of the string. The deviation of the string from a straight line may be approximated in terms of a finite Fourier sum of the string's natural modes. For example, the deviation of the string from its unperturbated position may be recorded by an optical sensor or the like and analysed. According to one possibility, an image of the string in its deviated position may be recorded by a camera.

Alternatively, electrically inductive sensors may be used to detect the displacement of parts of the string. From this analysis, values for $c_y(n, t_0)$ may be calculated for a given time $t_0$, and in turn the values of any of $g_y(O,t_0)$, $\Gamma_{yz}(O, t_0)$, $B_x(O, t_0)$ and/or $B_{xz}(O, t_0)$ may be calculated. In this way, magnetic induction and magnetic gradient may be measured using the string.

However, when n takes an even value, i.e. for those terms of the infinite sum in Equation (2) corresponding to vibrational modes of the string having a node at $z=l/2$ (antisymmetric modes), the term involving $g_y(O, t)$ and $B_x(O, t)$ is equal to zero. When n is even therefore, $c_y$ is dependent only on $\Gamma_{yz}(O, t)$ and $B_{xz}(O, t)$ (and thermal noise).

Thus, by measuring only the amplitudes of antisymmetric modes in the Fourier sum, values for $\Gamma_{yz}(O, t_0)$ and $B_{xz}(O, t_0)$ may be calculated.

The sensing means may therefore comprise at least two sensors located symmetrically about the midpoint of the string. In this way, the sensors may be arranged to detect the amplitude of the anti-symmetric natural modes of the string in its deflected position, for example by differencing the output from each sensor. In a preferred arrangement, the sensors are located at positions corresponding to the antinodes of at least one anti-symmetric natural mode of the string, for example n=2, where the displacement of the string will be at a maximum.

The current through the string may be an alternating current. In this case, according to Equation (1) the string will undergo forced oscillations generated by the force due to the alternating current in the magnetic field. The terms in $B_x$ and $B_{xz}$ in Equation (1) will vary over time with the current I(t), whereas the terms in $g_y$ and $\Gamma_{yz}$ will remain constant for a quasi-static gravitational field. This variation may be used to distinguish displacement of the string due to the magnetic field from that due to the gravitational field, and thereby quantify the magnetic field.

Advantageously, the frequency of the alternating current may be selected to cause the string to resonate in one or more of its natural modes. In this case, the amplitude of the oscillation may be measured and will be equal to $c_y(n, t)$ if the string is resonating in the nth mode. As explained above, from the values of $c_y(n, t)$ the values of any of $g_y(O, t_0)$, $\Gamma_{yz}(O, t_0)$, $B_x(O, t_0)$ and/or $B_{xz}(O, t_0)$ may be calculated.

In a particularly advantageous arrangement, the frequency of the alternating current may be substantially equal to the frequency of one of the anti-symmetric natural modes of the string, i.e. the frequency of the alternating current may be an even multiple (n) of the fundamental frequency of the string.

For example, if the current through the string I(t) is selected to satisfy $I(t)=i \sin(\omega_n t)$, where $\omega_n$ is the frequency of the nth natural mode of the string (where n is even), the string will undergo forced oscillations which will lead to resonance of the string. At resonance, when damping is completely counteracted by the pumping force of the alternating current, the amplitude of the oscillations will be given by the following expression $$c_y(n, t) = -\frac{1}{n} \frac{\tau}{\omega_n} \frac{i}{\eta} \frac{l}{\Pi} B_{xz} \cos(\omega_n t) \tag{5}$$

Thus, the string resonates in the nth natural mode and according to Equation (5) the amplitude of the resonant oscillations is directly proportional to the magnetic gradient $B_{xz}$, and can therefore be used to measure this quantity. For example, sensors located at the antinodes of this mode, i.e. symmetrically about the midpoint of the string, may be used to measure the amplitude directly.

In a preferred embodiment, the frequency of the alternating current is twice the fundamental frequency of the string, i.e. n=2.

The string's deflection from its unperturbated position may be detected by any suitable displacement sensing device. When the string carries an alternating current, the sensing means may detect the displacement of the string by electromagnetic induction. The amplitude of the current induced in a conductor adjacent the string will be a direct function of the distance of the string from that conductor. Thus, in a preferred embodiment of the invention one or more fixed pick-up coils are arranged along the length of the string to act as displacement sensing means, the current induced in each coil being directly related to the string's displacement from its unperturbated position.

In a particularly advantageous embodiment, displacement sensors, for example pick-up coils, are arranged adjacent the string in two non-parallel, preferably orthogonal, planes, so as to be capable of measuring the string's displacement in two transverse directions simultaneously.

Advantageously, the alternating current may be used to demodulate the signals from the displacement sensors. For example, when the frequency of the alternating current is an even multiple of the fundamental frequency of the string, the frequency of the signal generated in an electromagnetic pick-up element, for example a coil, adjacent the resonating string is a multiple of the signal due to the alternating current through the string in its unperturbated position, say $\sin(\omega_n t)$, with the signal due to the physical oscillation of the string, say $-\cos(\omega_n t)$, which is the integral of the alternating current function. This multiplication results in a signal from the sensors of frequency $2\omega_n$ can be generated from the alternating current to synchronously detect the sensor signals. Because both signals are generated from the same source, it is ensured that the frequency relationship is constant.

The voltage excited in the pick-up coils due to electromagnetic induction, is given by the following expression $$V_e = G \times B_{xz} \times \cos(2\omega_n t) \tag{6}$$

where G is the gain in the primary inductive transducer, for example a pair of pick-up coils. The value of G is defined by the geometrical configuration of the pick-up coils and is proportional to the current through the string.

In a preferred embodiment, the string and preferably also the sensing means is cooled to reduce the effect of thermal noise on the measurements. For example the apparatus may be immersed in a bath of liquid nitrogen or other suitable coolant.

The apparatus may comprise more than one string, for example three, four, five or more strings. The strings may be arranged at arbitrary angles to each other in order to measure simultaneously all the independent elements of the magnetic gradient tensor.

BRIEF DESCRIPTION OF THE DRAWINGS

Some embodiments of the invention will now be described by way of example only and with reference to the accompanying drawings, in which.

DETAILED DESCRIPTION OF THE PREFERRED EMBODIMENT

Figure 1:
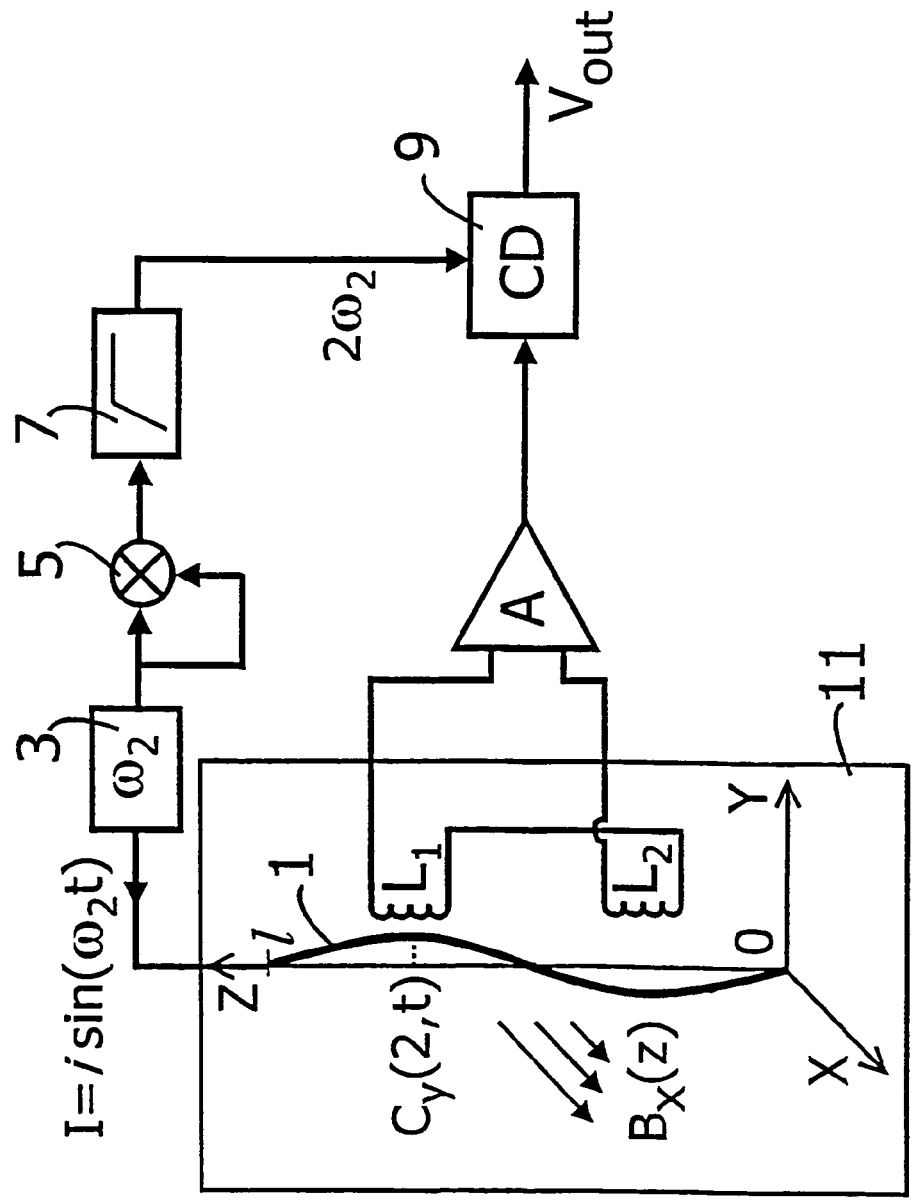
FIG. 1 is a general schematic representation of a preferred embodiment of the invention.

A single channel prototype of a device according to the invention is shown in FIG. 1. The device comprises a flexible string 1. The string has, in this embodiment, a length l=26 cm, is 0.25 mm in diameter and is fixed at its ends in a ceramic housing. The string is preferably formed of a wire of low mass-per-unit length and relatively high tensile strength. In the example shown, the string is formed of composite zinc clad silver wire with a mass-per-unit length of $0.44 \times 10^{-3}$ kgm$^{-1}$ and a tensile strength of 130,000 psi (900 MNm$^{-2}$).

The conductive string is oriented vertically and two pick-up coils L1 and L2 are connected in series and directly coupled to a low noise amplifier A. The pick-up coils L1, L2 are connected in antiphase such that identical signals which are induced in each coil cancel out, whereas opposite signals are added together. This configuration (when demodulation is carried out at a frequency of $2\omega_2$) excludes the influence of the uniform magnetic field generated by the current-carrying string 1 which forms an offset signal at the input of the amplifier A when the string 1 is unperturbed from its straight line configuration. This increases the dynamic range of the magnetic gradiometer. It should be noted that the uniform magnetic field produced by the alternating current of frequency $\omega_2$ through the string 1 is also variable with the frequency $\omega_2$ and for this reason is cut off by demodulation at a frequency of $2\omega_2$.

The string 1 is pumped with a sinusoidal current $I(t)=i\sin(\omega_2 t)$ from a signal generator 3. The same current is used to form a reference signal at twice the pumping current frequency $2\omega_2$ by means of a multiplier 5 and a high-pass filter 7. The frequency $\omega_2$ of the pumping current is twice the fundamental frequency of the string. The reference signal and the output from the low-noise amplifier A are input to a synchronous detector 9. The output voltage $V_{out}$ of the synchronous detector is directly proportional to a magnetic gradient $B_{xz}$ around the string 1 and is the output of the device.

The string 1 and the pick-up coils L1, L2 are situated inside a cryogenic nitrogen bath 11 at 77K. This increases greatly the signal-to-noise ratio by minimising environmental thermal noise influence and Johnson noise inside the pick-up coils themselves, as well as increasing the stability of the mechanical parameters of the string 1, in particular the stability of the amplitude of its forced resonant oscillations.

The prototype shown in FIG. 1 was tested in laboratory conditions. The string was stretched inside a ceramic housing and a second resonant mode of 484 Hz was obtained. Two coreless pick-up coils of 350 turns each were used, coupled to a commercially available Stanford Research Lock-In amplifier having an input noise of approximately 6 nV per root Hz. The output signal was detected at the doubled 484 Hz frequency (968 Hz) and the bandwidth was chosen to be 0.3 Hz.

A small magnet was moved beside the experimental set-up, and a clear magnetic gradient signal was observed. During the experiment the string was shaken and moved without the magnet present. The apparatus did not respond to this movement. However, a DC response to the position of the magnet was produced when the magnet was returned.

Figure 2:
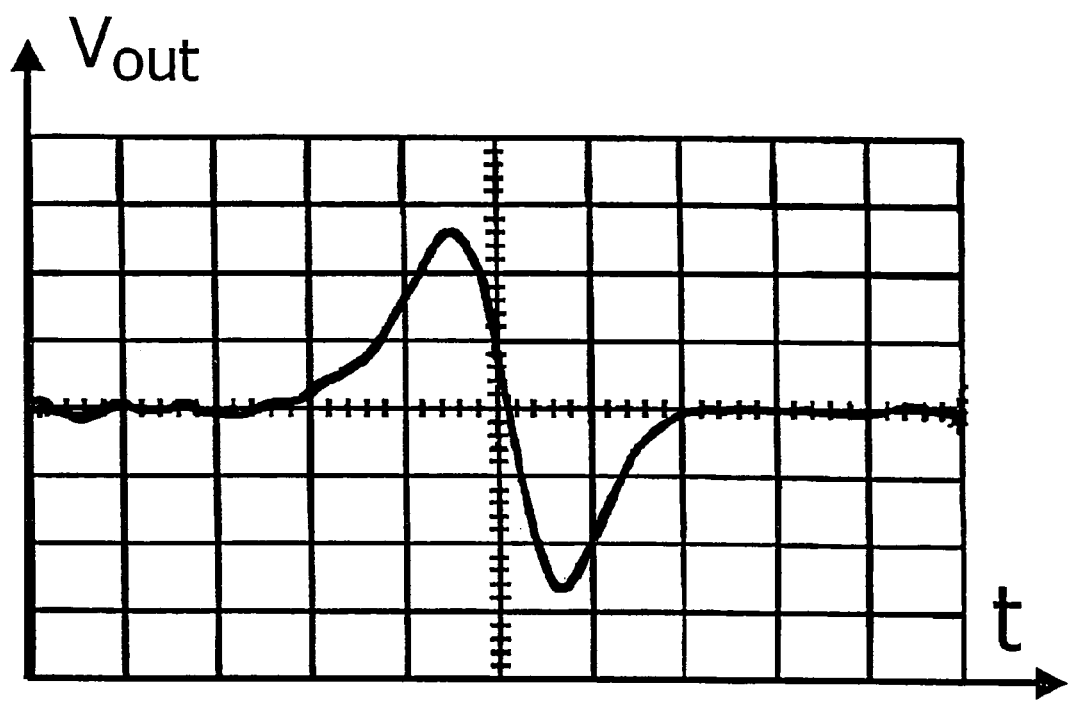
FIG. 2 represents an experiment carried out using the embodiment of FIG. 1.
Figure 2:
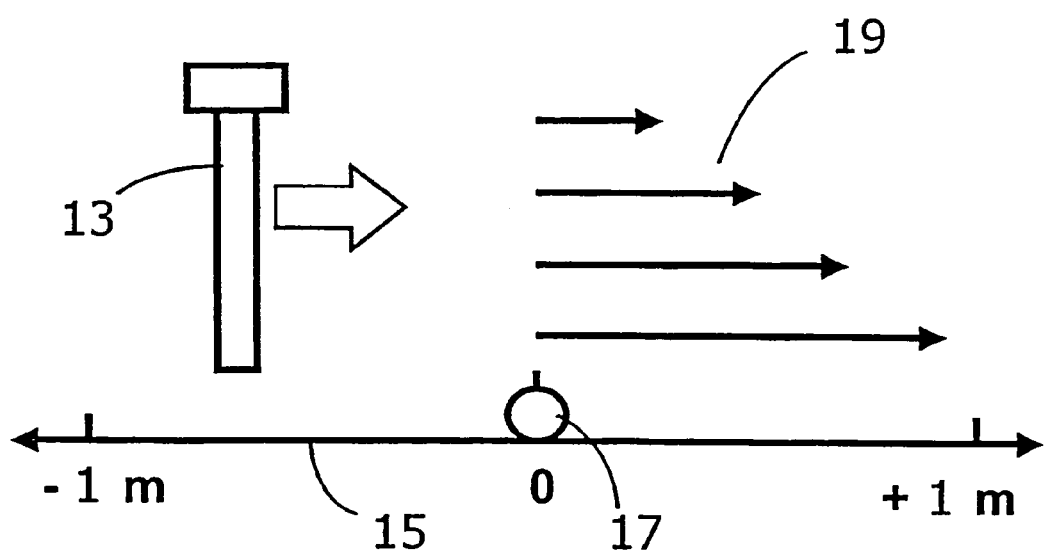

In another experiment represented schematically in FIG. 2, the magnetic gradiometer prototype 13 of FIG. 1 was placed onto a mobile frame and moved continuously along a 2 meter long track 15 over a magnetic field source 17 (shown in the FIG. 2 by a dark spot). The magnetic field source 17 generated a field of differential forces proportional to $B_x \times I_z$ represented schematically in FIG. 2 by arrows 19. The approximate speed of the prototype was one centimeter per second. The typical sensor response was recorded from the screen of an oscilloscope and is shown in FIG. 2 as a plot of the output voltage $V_{out}$ against time t.

Thus, the experiments have clearly shown a differential response of the string sensor typical to magnetic gradiometry. By using a commercial HT$_c$ superconducting quantum interference device (SQUID) instead of the low-noise amplifier A, the sensitivity to magnetic gradients would increase to a level so high that it would be easy to detect, for example, treasure-bearing remains of a submarine or of a ship from a reasonable distance.

Another embodiment of the invention, according to which a very high sensitivity to magnetic gradients can be achieved without using SQUIDs, has been tested experimentally.

In this second embodiment, the string 1 is pumped with an additional carrier-frequency current and inductively coupled to a resonant bridge comprising two pick-up coils connected in a gradiometric configuration in parallel with a capacitance and tuned to the carrier frequency. This frequency is chosen to be far removed from the string's effective mechanical bandwidth which is normally limited to a few kHz even for very stiff strings. In this case, mechanical displacements of the string give a low-frequency modulation (at the rate of the second natural mode of the string) of the carrier-frequency voltage across the bridge.

The string and the resonant bridge are cooled to 77 K to reduce the effect of thermal noise on measurements.

A double-lock-in scheme provides, firstly amplification and detection of the carrier signal and, secondly, amplification and detection of the low-frequency envelope with an amplitude proportional to the measured magnetic gradient.

Figure 3:
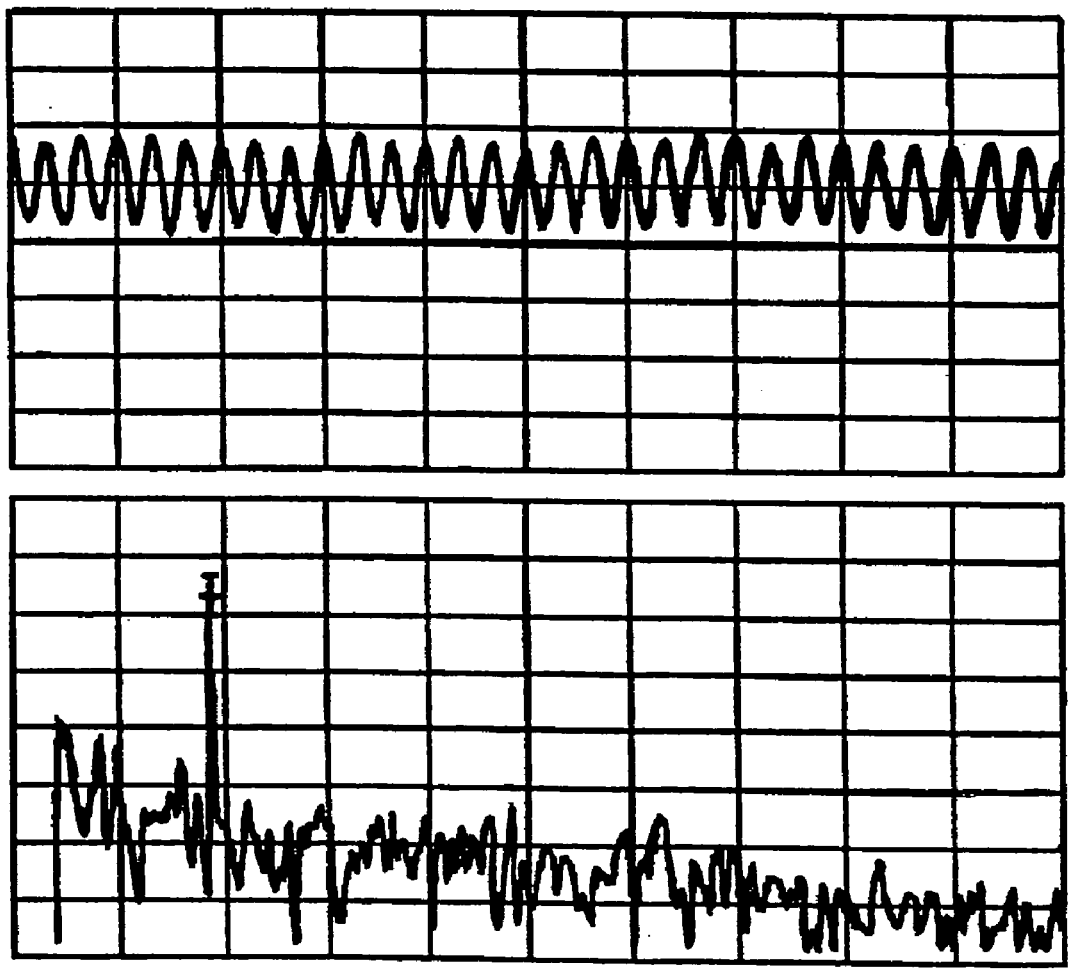
FIG. 3 shows experimental results achieved with a second embodiment of the invention.

The prototype measuring system according to the invention was tested in a gradient field and the results of the test are shown in FIG. 3. The upper curve shows the magnetic gradient signal in the time domain. The amplitude of the magnetic gradient signal is approximately 16 nT/m, the frequency of the signal is 0.3 Hz, and the scale of the screen is 10 seconds per division. The lower curve shows the spectrum of the magnetic gradiometer output signal. The signal frequency is marked by the cursor. The scale is 0.2 Hz per horizontal division and 10.0 dBm per vertical division. The estimate of the signal to noise ratio gives a sensitivity threshold of approximately 0.36 nT/m per root Hz, for this particular sensor configuration. The observed noise is not instrumental but reflects the magnetic environment around the experimental set-up.

The invention claimed is:

1. Apparatus for magnetic gradiometry comprising:
a string fixed at longitudinally spaced ends and having a midpoint, said string held under tension and arranged to carry a current;
at least two sensors symmetrically longitudinally positioned about the midpoint of said string and arranged to detect a transverse displacement of said string from an unperturbated position, due to a magnetic field acting on said string; and
an output arranged to provide a signal representing a measurement of the magnetic gradient of said magnetic field.

2. Apparatus as claimed in claim 1, wherein the string is arranged to carry an alternating current.

3. Apparatus as claimed in claim 2, wherein the alternating current has a frequency which is substantially equal to a frequency of a natural anti-symmetric mode of said string.

4. Apparatus as claimed in claim 3, wherein the string has a fundamental frequency and the frequency of the alternating current is twice the fundamental frequency of the string.

5. Apparatus as claimed in claim 2, wherein the sensors are arranged to generate a detection signal due to the transverse displacement of the string and the apparatus further comprises demodulating means arranged to demodulate the detection signal with a demodulation signal, the demodulation signal having a frequency twice that of the alternating current.

6. Apparatus as claimed in claim 1, wherein each of said sensors comprise at least one pick-up coil arranged such that, in use, a current is induced in the coil by the current passing through the string.

7. Apparatus as claimed in claim 1 comprising means for detecting the transverse displacement of said string in two non-parallel planes.

8. A method of magnetic gradiometry comprising:
providing a string fixed at longitudinally spaced ends and having a midpoint, said string held under tension and carrying a current;
detecting, by means of at least two sensors symmetrically longitudinally positioned about the midpoint of said string, a traverse displacement of said string from an unperturbated position, due to a magnetic field acting on said string; and
outputting a signal representing a measurement of the magnetic gradient of said magnetic field.

9. A method as claimed in claim 8, wherein the string carries an alternating current.

10. A method as claimed in claim 9, wherein the alternating current has a frequency which is substantially equal to a frequency of a natural anti-symmetric mode of said string.

11. A method as claimed in claim 10, wherein the string has a fundamental frequency and the frequency of the alternating current is twice the fundamental frequency of the string.

12. A method as claimed in claim 9, comprising a step of detecting the transverse displacement of the string including demodulating a signal due to the displacement of the string with a demodulating frequency which is twice the frequency of the alternating current through the string.

13. A method as claimed in claim 8, wherein the displacement of the string is detected electromagnetically.

14. A method as claimed in claim 13, wherein the displacement of the string is detected in two non-parallel planes.

15. Apparatus as claimed in claim 3, wherein the sensors are arranged to generate a detection signal due to the transverse displacement of the string and the apparatus further comprises demodulating means arranged to demodulate the detection signal with a demodulation signal, the demodulation signal having a frequency twice that of the alternating current.

16. Apparatus as claimed in claim 4, wherein the sensors are arranged to generate a detection signal due to the transverse, displacement of the string and the apparatus further comprises demodulating means arranged to demodulate the detection signal with a demodulation signal, the demodulation signal having a frequency twice that of the alternating current.

17. Apparatus as claimed in claim 2, wherein each of said sensors comprise at least one pick-up coil arranged such that, in use, a current is induced in the coil by the current passing through the string.

18. Apparatus as claimed in claim 3 comprising means for detecting the transverse displacement of said string in two non-parallel planes.

19. A method as claimed in claim 10, comprising a step of detecting the transverse displacement of the string including demodulating a signal due to the displacement of the string with a demodulating frequency which is twice the frequency of the alternating current through the string.

20. A method as claimed in claim 11, comprising a step of detecting the transverse displacement of the string including demodulating a signal due to the displacement of the string with a demodulating frequency which is twice the frequency of the alternating current through the string.

* * * * *